United States Patent
Asami

(10) Patent No.: US 9,048,356 B2
(45) Date of Patent: Jun. 2, 2015

(54) PHOTOELECTRIC CONVERSION DEVICE

(75) Inventor: Yoshinobu Asami, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 942 days.

(21) Appl. No.: 13/163,091

(22) Filed: Jun. 17, 2011

(65) Prior Publication Data

US 2011/0308568 A1 Dec. 22, 2011

(30) Foreign Application Priority Data

Jun. 18, 2010 (JP) ................. 2010-138889

(51) Int. Cl.
| | |
|---|---|
| H01L 31/046 | (2014.01) |
| H01L 31/028 | (2006.01) |
| H01L 27/30 | (2006.01) |
| H01L 31/0368 | (2006.01) |
| H01L 31/0376 | (2006.01) |
| H01L 31/0687 | (2012.01) |
| H01L 31/0725 | (2012.01) |
| H01L 31/076 | (2012.01) |

(52) U.S. Cl.
CPC ............ *H01L 31/028* (2013.01); *H01L 27/302* (2013.01); *H01L 31/03682* (2013.01); *H01L 31/03685* (2013.01); *H01L 31/03762* (2013.01); *H01L 31/0687* (2013.01); *H01L 31/0725* (2013.01); *H01L 31/076* (2013.01); *Y02E 10/544* (2013.01); *Y02E 10/545* (2013.01); *Y02E 10/546* (2013.01); *Y02E 10/548* (2013.01); *Y02E 10/547* (2013.01)

(58) Field of Classification Search
None
See application file for complete search history.

(56) References Cited

U.S. PATENT DOCUMENTS

| | | | |
|---|---|---|---|
| 4,272,641 A * | 6/1981 | Hanak | ............ 136/249 |
| 4,316,049 A | 2/1982 | Hanak | |
| 4,496,788 A | 1/1985 | Hamakawa et al. | |
| 4,680,422 A | 7/1987 | Stanbery | |
| 4,684,761 A | 8/1987 | Devaney | |
| 4,878,097 A | 10/1989 | Yamazaki | |
| 4,950,614 A | 8/1990 | Yamazaki | |
| 4,954,856 A | 9/1990 | Yamazaki | |
| 4,971,919 A | 11/1990 | Yamazaki | |
| 5,045,482 A | 9/1991 | Yamazaki | |
| 5,370,747 A | 12/1994 | Noguchi et al. | |
| 5,478,777 A | 12/1995 | Yamazaki | |
| 5,536,333 A | 7/1996 | Foote et al. | |
| 5,580,820 A | 12/1996 | Yamazaki | |
| 5,656,098 A | 8/1997 | Ishikawa et al. | |

(Continued)

FOREIGN PATENT DOCUMENTS

| | | |
|---|---|---|
| JP | 11-274532 | 10/1999 |
| JP | 2000-196114 | 7/2000 |
| WO | WO 2010/052953 | * 5/2010 |

*Primary Examiner* — Jayne Mershon
(74) *Attorney, Agent, or Firm* — Husch Blackwell LLP

(57) ABSTRACT

A photoelectric conversion device includes a first cell including a photoelectric conversion layer, a second cell over the first cell including a photoelectric conversion layer formed of a material having a wider band gap than that of the first cell, first and second electrodes under a surface of the first cell which is opposite to the second cell, and a third electrode over a surface of the second cell which is opposite to the first cell. The first and second cells each include a p-n or p-i-n junction, the first and second cells are in contact with each other and a p-n junction is formed in a contact portion therebetween, the first cell is electrically connected to the first and second electrodes to form a back contact structure, and the second cell is electrically connected to the third electrode.

8 Claims, 12 Drawing Sheets

(56) References Cited

U.S. PATENT DOCUMENTS

| | | |
|---|---|---|
| 5,668,050 A | 9/1997 | Iwasaki |
| 5,720,827 A | 2/1998 | Simmons |
| 6,166,320 A * | 12/2000 | Nagashima et al. .......... 136/249 |
| 6,191,353 B1 | 2/2001 | Shiotsuka et al. |
| 6,566,277 B1 | 5/2003 | Nakagawa et al. |
| 6,930,025 B2 | 8/2005 | Nakayama et al. |
| 7,750,425 B2 | 7/2010 | Forrest et al. |
| 8,338,218 B2 | 12/2012 | Shimomura |
| 8,704,083 B2 | 4/2014 | Yamazaki et al. |
| 8,816,194 B2 | 8/2014 | Yamazaki et al. |
| 2002/0197460 A1 | 12/2002 | Kaneko et al. |
| 2003/0015234 A1 | 1/2003 | Yasuno |
| 2009/0127555 A1 | 5/2009 | Yamazaki et al. |
| 2009/0139558 A1 | 6/2009 | Yamazaki et al. |
| 2009/0165854 A1 | 7/2009 | Yamazaki et al. |
| 2009/0211635 A1 * | 8/2009 | Niira et al. .................... 136/258 |
| 2009/0242032 A1 | 10/2009 | Yamazaki et al. |
| 2010/0307557 A1 | 12/2010 | Yamazaki et al. |
| 2010/0307558 A1 | 12/2010 | Yamazaki et al. |
| 2011/0303289 A1 * | 12/2011 | Goya et al. .................... 136/261 |
| 2011/0308587 A1 | 12/2011 | Yamazaki |

* cited by examiner

PHOTOELECTRIC CONVERSION DEVICE

BACKGROUND OF THE INVENTION

1. Field of the Invention

The technical field relates to a photoelectric conversion device and a method for manufacturing the photoelectric conversion device.

2. Description of the Related Art

Global warming gets serious and clean energy has attracted attention because a greenhouse effect gas is not generated in producing such energy. Photoelectric conversion devices such as solar cells are typical devices for producing clean energy and are being actively developed and put to practical use throughout the world.

However, current solar cells do not have sufficient performance yet. A tandem solar cell in which a plurality of cells are stacked for improvement in performance is widely known. In addition, a tandem solar cell as disclosed in Patent Document 1 for improvement in power generation efficiency is proposed.

REFERENCE

Patent Document

[Patent Document 1] Japanese Published Patent Application No. H11-274532

SUMMARY OF THE INVENTION

It is an object of an embodiment of the present invention to provide a photoelectric conversion device whose photoelectric conversion efficiency is improved.

It is an object of another embodiment of the present invention to provide a photoelectric conversion device which outputs high voltage.

It is an object of another embodiment of the present invention to provide a photoelectric conversion device which outputs large current.

It is an object of another embodiment of the present invention to provide a photoelectric conversion device whose output characteristics (current-voltage characteristics) are improved.

According to an embodiment of the present invention, a photoelectric conversion device includes: a first cell including a photoelectric conversion layer, a second cell stacked over the first cell and including a photoelectric conversion layer formed of a material having a wider band gap than that of the first cell, a first electrode and a second electrode provided under a surface of the first cell which is opposite to the second cell, and a third electrode provided over a surface of the second cell which is opposite to the first cell. The first cell and the second cell each include a p-n junction or a p-i-n junction therein, the first cell and the second cell are in contact with each other and a p-n junction is formed in a contact portion therebetween, the first cell is electrically connected to the first electrode and the second electrode to form a back contact structure, and the second cell is electrically connected to the third electrode.

According to another embodiment of the present invention, a photoelectric conversion device includes: a first cell including a photoelectric conversion layer, a second cell stacked over the first cell and including a photoelectric conversion layer formed of a material having a wider band gap than that of the first cell, an insulating layer provided between the first cell and the second cell and including an opening, a first electrode and a second electrode provided under a surface of the first cell which is opposite to the second cell, and a third electrode provided over a surface of the second cell which is opposite to the first cell. The first cell and the second cell each include a p-n junction or a p-i-n junction therein, the first cell and the second cell are in contact with each other through the opening provided in the insulating layer and a p-n junction is formed in a contact portion therebetween, the first cell is electrically connected to the first electrode and the second electrode to form a back contact structure, and the second cell is electrically connected to the third electrode.

In the above structure, the photoelectric conversion layer included in the first cell can be formed of single crystal silicon or polycrystalline silicon, and the photoelectric conversion layer included in the second cell can be formed of amorphous silicon.

In the above structure, voltage can be obtained between the first electrode and the third electrode and between the first electrode and the second electrode.

In the above structure, current can be obtained between the first electrode and the third electrode and between the first electrode and the second electrode.

The term "photoelectric conversion layer" in this specification includes a semiconductor layer (a semiconductor region) by which a photoelectric effect (an internal photoelectric effect) is achieved and moreover an impurity semiconductor layer (an impurity semiconductor region) which is provided to form an internal electric field or a semiconductor junction. That is, a photoelectric conversion layer in this specification refers to a semiconductor layer having a junction typified by a p-i-n junction or the like.

The term "p-i-n junction" in this specification includes a junction in which a p-type semiconductor layer, an i-type semiconductor layer, and an n-type semiconductor layer are stacked in this order from the light-incidence side and a junction in which an n-type semiconductor layer, an i-type semiconductor layer, and a p-type semiconductor layer are stacked in this order from the light-incidence side.

The ordinal numbers such as "first", "second", and "third" in this specification are used for convenience to distinguish elements. Therefore, these ordinal numbers do not limit the number, the arrangement, and the order of steps.

In accordance with an embodiment of the present invention, it is possible to provide a photoelectric conversion device whose photoelectric conversion efficiency is improved. In accordance with another embodiment of the present invention, it is possible to provide a photoelectric conversion device which outputs high voltage. In accordance with another embodiment of the present invention, it is possible to provide a photoelectric conversion device which outputs large current. In accordance with another embodiment of the present invention, it is possible to provide a photoelectric conversion device whose output characteristics (current-voltage characteristics) are improved.

DETAILED DESCRIPTION OF THE INVENTION

Figure 1:
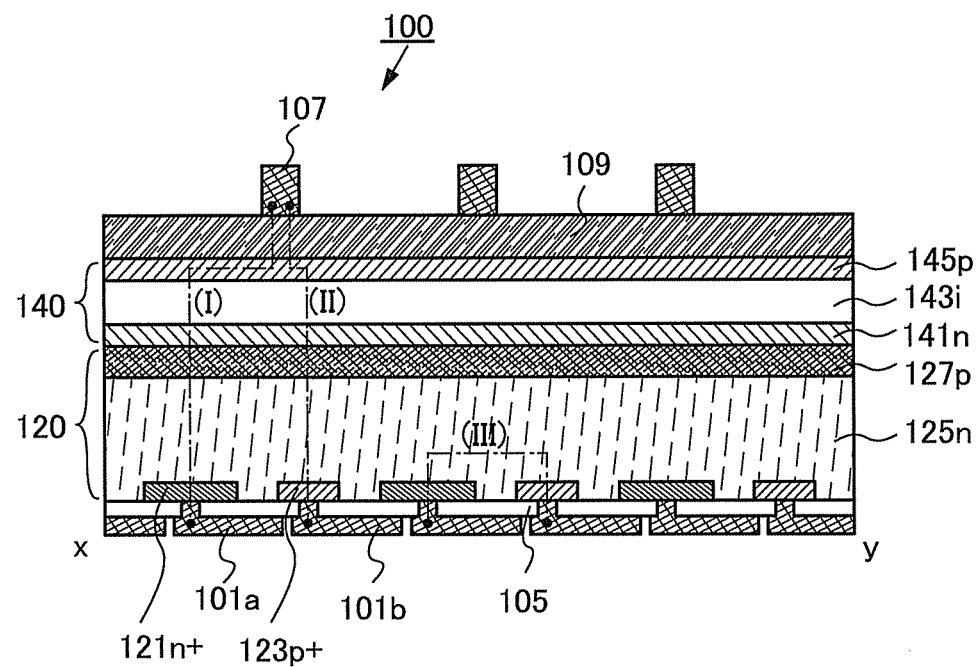
FIG. 1 is a schematic cross-sectional view illustrating an example of a photoelectric conversion device.

Hereinafter, embodiments will be described in detail with reference to the accompanying drawings. However, since the embodiments described below can be embodied in many different modes, it is easily understood by those skilled in the art that modes and details thereof can be variously changed without departing from the spirit and the scope of the present invention. Therefore, the present invention should not be interpreted as being limited to the following description of the embodiments. In all the drawings for explaining the embodiments, the same portions or portions having similar functions are denoted with the same reference numerals and description of such portions is not repeated.

(Embodiment 1)

In this embodiment, a structure of a photoelectric conversion device according to an embodiment of the present invention will be described.

Figure 2A:
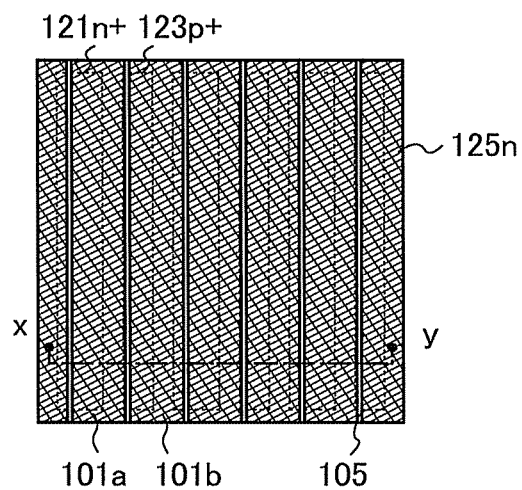
FIGS. 2A to 2C are schematic plan views illustrating an example of a photoelectric conversion device.

FIG. 1 is an example of a schematic cross-sectional view of a photoelectric conversion device according to this embodiment. FIG. 2A is an example of a schematic plan view of the photoelectric conversion device according to this embodiment. FIG. 1 illustrates a cross section along dashed and dotted line x-y in FIG. 2A.

A photoelectric conversion device 100 includes a first cell 120, a second cell 140 stacked over the first cell 120, a first electrode 101a and a second electrode 101b which are electrically connected to the first cell 120, and a third electrode 107 electrically connected to the second cell 140. The first electrode 101a and the second electrode 101b are provided so as to be connected to the first cell 120 at a surface which is opposite to the second cell 140. The third electrode 107 is provided so as to be connected to the second cell 140 at a surface which is opposite to the first cell 120. The first electrode 101a and the second electrode 101b serve as rear electrodes, and the third electrode 107 serves as a grid electrode.

One surface of the first cell 120 is in contact with the second cell 140, and the other surface thereof is provided with the first electrode 101a and the second electrode 101b. The first electrode 101a and the second electrode 101b are electrically isolated from each other and electrically connected to the first cell 120 separately.

One surface of the second cell 140 is in contact with the first cell 120, and the other surface thereof is provided with the third electrode 107. In this embodiment, the other surface of the second cell 140 is also provided with a transparent conductive film 109. The third electrode 107 is provided over the other surface of the second cell 140 with the transparent conductive film 109 provided therebetween and electrically connected to the second cell 140.

The first cell 120 and the second cell 140 each include a p-n junction or a p-i-n junction therein. In addition, the first cell 120 and the second cell 140 are in contact with each other, and a p-n junction is formed in a contact portion therebetween.

The first cell 120 and the second cell 140 are formed such that the first cell 120 includes a material whose band gap is narrow (also referred to as a narrow-gap material) and the second cell 140 includes a material whose band gap is wide (also referred to as a wide-gap material), when the band gap of a material used for forming a photoelectric conversion layer in the first cell 120 and the band gap of a material used for forming a photoelectric conversion layer in the second cell 140 are compared with each other. When the second cell 140 provided on the light-receiving side is formed using a material having a wider band gap than that of the first cell 120, photoelectric conversion can be performed efficiently. For example, the first cell 120 is formed using single crystal silicon (whose band gap is about 1.12 eV) or polycrystalline silicon, whereas the second cell 140 is formed using amorphous silicon (whose band gap is about 1.6 eV to 1.8 eV).

Note that light in a short wavelength range (including a visible light range) has higher energy than light in a long wavelength range and is thus easily absorbed. Therefore, when the light penetration depths are compared, light in a short wavelength range has a shallow penetration depth, and light in a long wavelength range has a deep penetration depth. When energy is compared, light in a short wavelength range has high energy, and light in a long wavelength range has low energy; thus, it is preferable that light in a short wavelength range be absorbed in the second cell 140 having a wide band gap and light in a long wavelength range be absorbed in the first cell 120 having a narrow band gap. From the above, it is preferable to form a tandem junction by providing the second cell 140 formed using a wide-gap material on the light-receiving side and providing the first cell 120 formed using a narrow-gap material on the rear surface side. With this structure, part of energy obtained from light absorbed by the photoelectric conversion layer in the photoelectric conversion device, which is greater than or equal to that of the energy band gap of the photoelectric conversion layer in the photoelectric conversion device, can be prevented from being lost as thermal energy; thus, power can be generated efficiently.

The first cell 120 includes a third impurity semiconductor layer 125n and a fourth impurity semiconductor layer 127p. The third impurity semiconductor layer 125n includes a partly provided first impurity semiconductor region $121n^+$ and a partly provided second impurity semiconductor region $123p^+$. In the first cell 120, a photoelectric conversion layer is formed with the third impurity semiconductor layer 125n and the fourth impurity semiconductor layer 127p.

Figure 2B:
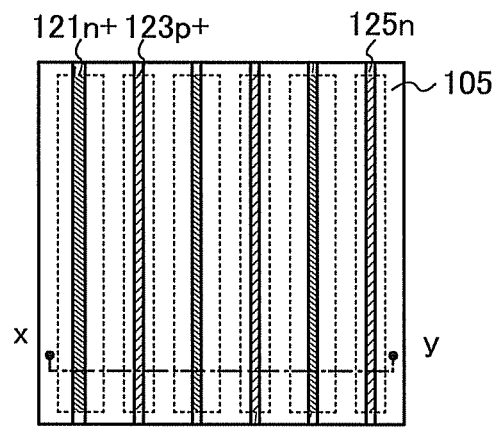
Figure 2C:
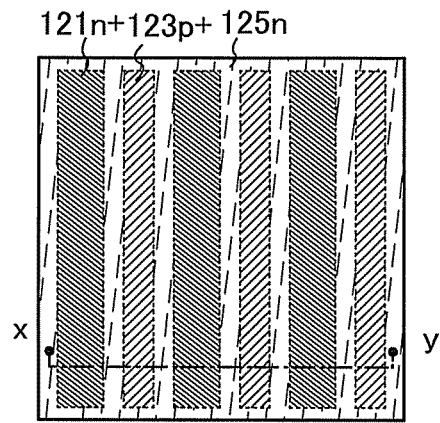

The first impurity semiconductor region $121n^+$ and the second impurity semiconductor region $123p^+$ are isolated from each other. For example, as illustrated in FIG. 2C, the first impurity semiconductor region $121n^+$ and the second impurity semiconductor region $123p^+$ are provided so as to be isolated from each other. The fourth impurity semiconductor layer 127p is stacked over the third impurity semiconductor layer 125n.

One side of the third impurity semiconductor layer 125n is in contact with the fourth impurity semiconductor layer 127p, and the other side thereof is provided with the first impurity semiconductor region $121n^+$ and the second impurity semiconductor region $123p^+$.

One of the first impurity semiconductor region $121n^+$ and the second impurity semiconductor region $123p^+$ is an n-type semiconductor region, and the other is a p-type semiconductor region. The n-type semiconductor region (or an n-type semiconductor layer) is a semiconductor region (or a semiconductor layer) containing an impurity element imparting n-type conductivity (e.g., an element belonging to Group 15 of the periodic table, such as phosphorus). The first impurity semiconductor region $121n^+$ and the second impurity semiconductor region $123p^+$ can be formed by using single crystal silicon or polycrystalline silicon as a semiconductor layer to which an impurity is added. In addition, amorphous silicon or microcrystalline silicon may be used in addition to single crystal silicon and polycrystalline silicon. Further, carbon or nitrogen may be added to amorphous silicon or microcrystalline silicon. The p-type semiconductor region (or a p-type semiconductor layer) is a semiconductor region (or a semiconductor layer) containing an impurity element imparting p-type conductivity (e.g., an element belonging to Group 13 of the periodic table, such as boron). In this embodiment, an example in which the first impurity semiconductor region $121n^+$ is an n-type semiconductor region formed using crystalline silicon and the second impurity semiconductor region $123p^+$ is a p-type semiconductor region formed using crystalline silicon is described.

One of the third impurity semiconductor layer $125n$ and the fourth impurity semiconductor layer $127p$ is an n-type semiconductor layer, and the other is a p-type semiconductor layer. As described above, for example, the n-type semiconductor layer is a semiconductor layer containing phosphorus or the like and the p-type semiconductor layer is a semiconductor layer containing boron or the like. The third impurity semiconductor layer $125n$ and the fourth impurity semiconductor layer $127p$ can be formed by using single crystalline silicon or polycrystalline silicon as a semiconductor layer to which an impurity is added. In order to improve transmissivity, in addition to single crystal silicon and polycrystalline silicon, amorphous silicon or microcrystalline silicon can be used as a semiconductor layer to which an impurity is added. Further, carbon or nitrogen may be added to amorphous silicon or microcrystalline silicon. In this embodiment, an example in which the third impurity semiconductor layer $125n$ is an n-type semiconductor layer formed using crystalline silicon and the fourth impurity semiconductor layer $127p$ is a p-type semiconductor layer formed using crystalline silicon is described.

The first impurity semiconductor region $121n^+$ is electrically connected to the first electrode $101a$, and the second impurity semiconductor region $123p^+$ is electrically connected to the second electrode $101b$. For example, an insulating layer 105 provided with openings as illustrated in FIG. 2B is provided on the first impurity semiconductor region $121n^+$ and the second impurity semiconductor region $123p^+$, and the first impurity semiconductor region $121n^+$ and the first electrode $101a$ are connected to each other through the opening provided in the insulating layer 105. The second impurity semiconductor region $123p^+$ and the second electrode $101b$ are connected to each other in a manner similar to the above. Electric connection between the first impurity semiconductor region $121n^+$ and the first electrode $101a$ and electric connection between the second impurity semiconductor region $123p^+$ and the second electrode $101b$ can be easily separated from each other with the insulating layer 105.

For example, the first electrode $101a$ and the second electrode $101b$ are formed using aluminum, and the insulating layer 105 is formed using silicon oxide. The first electrode $101a$ and the second electrode $101b$ are arranged so as to cover the entire rear surface as much as possible, unless they are in electric contact with each other. The insulating layer 105 is formed to a thickness of greater than or equal to 10 nm and less than or equal to 160 nm, preferably greater than or equal to 60 nm and less than or equal to 140 nm. In such a manner, as well as electric isolation between the first impurity semiconductor region $121n^+$ and the second impurity semiconductor region $123p^+$, light reflectivity of the first electrode $101a$ and the second electrode $101b$ provided on the rear surface side can be increased, whereby the amount of light absorption in the photoelectric conversion layer can be increased and photoelectric current can be increased.

The first electrode $101a$ and the second electrode $101b$ are positioned opposite to the light-receiving side of the photoelectric conversion device 100. The structure with the first electrode $101a$ and the second electrode $101b$ as illustrated in FIG. 1 and FIG. 2A is referred to as a so-called back contact structure or rear electrode type.

The second cell 140 includes a fifth impurity semiconductor layer $141n$, a sixth semiconductor layer $143i$, and a seventh impurity semiconductor layer $145p$. In the second cell 140, a photoelectric conversion layer is formed with the fifth impurity semiconductor layer $141n$, the sixth semiconductor layer $143i$, and the seventh impurity semiconductor layer $145p$. The sixth semiconductor layer $143i$ is stacked over the fifth impurity semiconductor layer $141n$, and the seventh impurity semiconductor layer $145p$ is stacked over the sixth semiconductor layer $143i$.

One surface of the fifth impurity semiconductor layer $141n$ is in contact with the fourth impurity semiconductor layer $127p$ of the first cell 120, and the other surface thereof is in contact with the sixth semiconductor layer $143i$. In this embodiment, the fifth impurity semiconductor layer $141n$ and the fourth impurity semiconductor layer $127p$ form a p-n junction. That is, a p-n junction is formed at a contact surface between the second cell 140 and the first cell 120.

In this embodiment, an example in which the fourth impurity semiconductor layer $127p$ is a p-type semiconductor layer is described. Therefore, the fifth impurity semiconductor layer $141n$ is an n-type semiconductor layer. It is needless to say that when the fourth impurity semiconductor layer $127p$ is an n-type semiconductor layer, the fifth impurity semiconductor layer $141n$ is a p-type semiconductor layer.

The sixth semiconductor layer $143i$ is an intrinsic or substantially intrinsic semiconductor layer. Specifically, the concentration of an impurity element which imparts n-type conductivity or p-type conductivity and is contained in the sixth semiconductor layer $143i$ is less than or equal to $1 \times 10^{18}/\text{cm}^3$, and photoconductivity of the sixth semiconductor layer $143i$ is greater than or equal to 100 times of dark conductivity thereof. In the case where the sixth semiconductor layer $143i$ is an amorphous semiconductor layer, the semiconductor layer exhibits low n-type conductivity in some cases when no impurity element for controlling valence electrons is added thereto intentionally. Therefore, an impurity element imparting p-type conductivity may be added during or after formation of the amorphous semiconductor layer. In such a case, the concentration of a p-type impurity element contained in the amorphous semiconductor layer is about $1 \times 10^{14}/\text{cm}^3$ to $6 \times 10^{16}/\text{cm}^3$.

One surface of the seventh impurity semiconductor layer $145p$ is in contact with the sixth semiconductor layer $143i$, and the other surface thereof is provided with the third electrode 107. In this embodiment, the other surface of the seventh impurity semiconductor layer $145p$ is also provided with the transparent conductive film 109, and the third electrode 107 is provided over the seventh impurity semiconductor layer $145p$ with the transparent conductive film 109 provided therebetween.

The seventh impurity semiconductor layer 145p is an impurity semiconductor layer having a conductivity type opposite to that of the fifth impurity semiconductor layer 141n. Since an example in which the fifth impurity semiconductor layer 141n is an n-type semiconductor layer is described in this embodiment, the seventh impurity semiconductor layer 145p is a p-type semiconductor layer.

The third electrode 107 is positioned on the light-receiving side of the photoelectric conversion device 100. It is preferable that, on the light-receiving side, light (the sunlight) can be received in an area that is as large as possible. Therefore, on the light-receiving side, the third electrode 107 is provided partly, and the transparent conductive film 109 is provided between the third electrode 107 and the second cell 140 (the seventh impurity semiconductor layer 145p). With the transparent conductive film 109, light reception is not hindered, and power can be generated efficiently. In addition, with the third electrode 107, series resistance can be reduced.

In order to reduce reflectivity on the light-receiving side, an anti-reflection film may be provided with the use of a material having a refractive index that is between refractive indices of the air and the transparent conductive film 109 over a region of the transparent conductive film 109, which is not provided with the third electrode 107. The anti-reflection film may have a single-layer structure or a layered structure. Alternatively, a texture structure in which the surface of the transparent conductive film 109 is made uneven may be used. The texture structure can reduce reflectivity on the light-receiving side. Accordingly, optical loss due to reflection at the light-receiving surface is reduced, and the amount of light absorption in the photoelectric conversion layer is increased, whereby photoelectric current can be increased and photoelectric conversion efficiency can be improved.

In the photoelectric conversion device 100 illustrated in FIG. 1 and FIGS. 2A to 2C, voltage and current can be obtained between the first electrode 101a and the second electrode 101b as well as between the first electrode 101a and the third electrode 107. All of voltage and current obtained between the first electrode 101a and the third electrode 107 and voltage and current obtained between the first electrode 101a and the second electrode 101b can be used. Therefore, the total output of the photoelectric conversion device 100 can be high, and output characteristics (current-voltage characteristics) can be improved, so that a photoelectric conversion device with high photoelectric conversion efficiency can be provided.

This embodiment can be combined with any of other embodiments as appropriate.

(Embodiment 2)

In this embodiment, characteristics of the photoelectric conversion device 100 described in Embodiment 1 will be described by being compared with those of a solar cell with a three-terminal structure disclosed in Patent Document 1 as appropriate.

Figure 3:
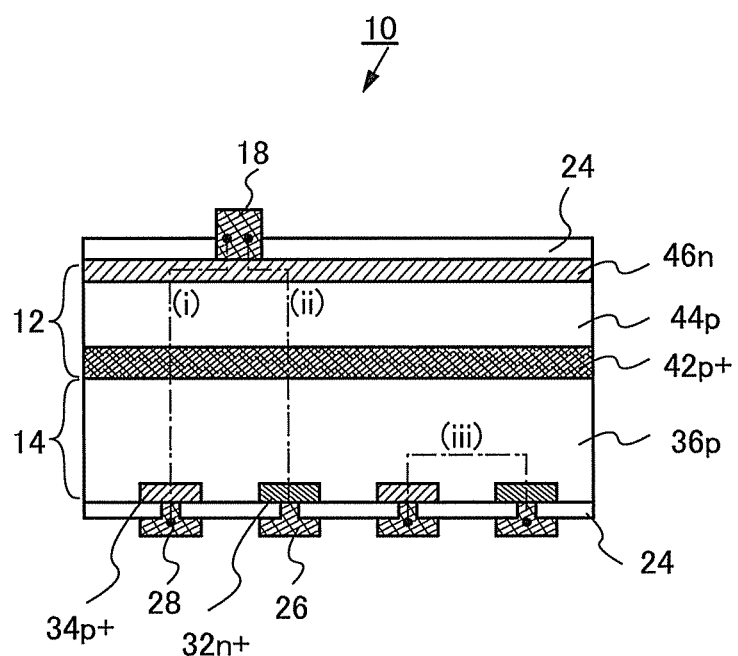
FIG. 3 is a view illustrating a conventional example of a photoelectric conversion device.

FIG. 3 illustrates a cross section of a solar cell 10 corresponding to FIG. 1 of Patent Document 1. The solar cell 10 has a structure in which an upper cell 12 having a wide band gap and a lower cell 14 having a narrow band gap are stacked. The upper cell 12 includes an n$^+$-layer (46n), a p-layer (44p), and a p$^+$-layer (42p$^+$) which are stacked. An upper electrode 18 is provided over the n$^+$-layer (46n) of the upper cell 12 with an insulating film 24 provided therebetween.

In the lower cell 14, an n$^+$-layer (32n$^+$) and a p$^+$-layer (34p$^+$) are alternately provided on a rear surface side of a p-layer (36p). A negative electrode 26 and a positive electrode 28 are connected to the n$^+$-layer (32n$^+$) and the p$^+$-layer (34p$^+$), respectively.

The solar cell 10 illustrated in FIG. 3 has a three-terminal structure in which the upper electrode 18, the negative electrode 26, and the positive electrode 28 are connected to the n$^+$-layer (46n) of the upper cell 12, the n$^+$-layer (32n$^+$) of the lower cell 14, and the p$^+$-layer (34p$^+$) of the lower cell 14, respectively. The p-layer (36p) of the lower cell 14 and the p$^+$-layer (42p$^+$) of the upper cell 12 are in contact with each other.

The photoelectric conversion device 100 illustrated in FIG. 1 of Embodiment 1 includes the n-layer and the p-layer which are sequentially stacked in the first cell 120, and the n-layer, the i-layer, and the p-layer which are sequentially stacked in the second cell 140. On the other hand, the solar cell 10 illustrated in FIG. 3 includes the p-layer in the lower cell 14 corresponding to the first cell, and the player, the p-layer, and the n-layer which are sequentially stacked in the upper cell 12 corresponding to the second cell.

In the photoelectric conversion device 100 illustrated in FIG. 1, a diode junction of a vertical direction is formed in each of the first cell 120 and the second cell 140. On the other hand, in the solar cell 10 illustrated in FIG. 3, the n-layer and the p-layer are formed in the upper cell 12 but only the p-layer is formed in the lower cell 14; this structure is different from that of the photoelectric conversion device illustrated in FIG. 1. In addition, although a p-n junction is formed at a junction between the first cell 120 and the second cell 140 in the photoelectric conversion device 100 illustrated in FIG. 1, the p$^+$-layer and the p-layer are in contact with each other at a junction between the upper cell 12 and the lower cell 14 in the solar cell 10 illustrated in FIG. 3; this structure is different from that of the photoelectric conversion device 100 illustrated in FIG. 1.

Figure 4:
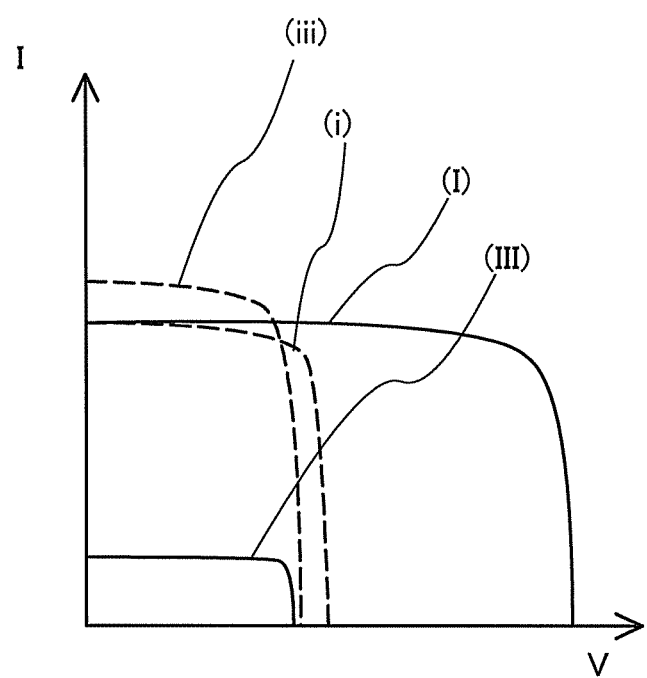
FIG. 4 is a graph showing examples of characteristics of photoelectric conversion devices.

FIG. 4 shows I-V characteristics assumed for the photoelectric conversion device 100 illustrated in FIG. 1 and I-V characteristics assumed for the solar cell 10 illustrated in FIG. 3. Characteristics (I) in FIG. 4 are characteristics in (I) (between the third electrode 107 and the first electrode 101a) in FIG. 1, and characteristics (III) in FIG. 4 are characteristics in (III) (between the first electrode 101a and the second electrode 101b) in FIG. 1. Characteristics (i) in FIG. 4 are characteristics in (i) (between the positive electrode 28 and the upper electrode 18) in FIG. 3, and characteristics (iii) in FIG. 4 are characteristics in (iii) (between the positive electrode 28 and the negative electrode 26) in FIG. 3.

The photoelectric conversion device 100 illustrated in FIG. 1 has a tandem junction including plural diode junctions in which the first cell 120 having a diode junction and the second cell 140 having a diode junction are stacked. On the other hand, since the lower cell 14 has only one polarity (the p-layer), the solar cell 10 illustrated in FIG. 3 has a tandem junction in which the upper cell 12 and the lower cell 14 include one diode junction as a whole. Therefore, voltage obtained in the solar cell 10 in FIG. 3 is lower than that in the case of the tandem junction including plural diode junctions. Specifically, as is clear from (I) and (i) in FIG. 4, there is a difference in output voltage. High voltage can be obtained in (I) of the photoelectric conversion device 100, as compared with the solar cell 10.

Figure 5A:
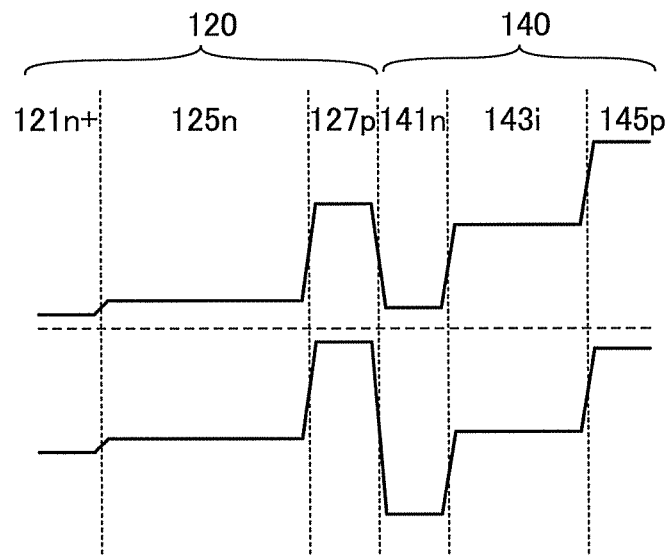
FIGS. 5A and 5B are diagrams illustrating energy band structures of a photoelectric conversion device.
Figure 5B:
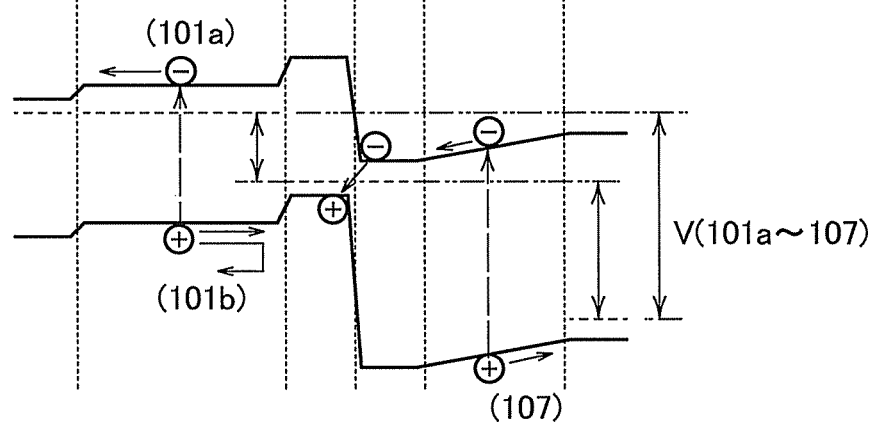

FIGS. 5A and 5B illustrate energy band structures of (I) in the photoelectric conversion device 100 illustrated in FIG. 1. FIG. 5A illustrates an energy band structure in an equilibrium state, and FIG. 5B illustrates an energy band structure at the time of light irradiation. Here, an example in which light enters from the second cell 140 side is illustrated. In addition, an example in which the first cell 120 in FIG. 1 is formed using single crystal silicon or polycrystalline silicon and the second cell 140 in FIG. 1 is formed using amorphous silicon is described.

Voltage V in FIG. 5B which is obtained in (I) of the photoelectric conversion device 100 equals to the sum of voltage that is obtained in the case where a photoelectric conversion device of a single junction is formed in the first cell 120 and voltage that is obtained in the case where a photoelectric conversion device of a single junction is formed in the second cell 140 (see V(101*a*~107) in FIG. 5B).

Figure 8A:
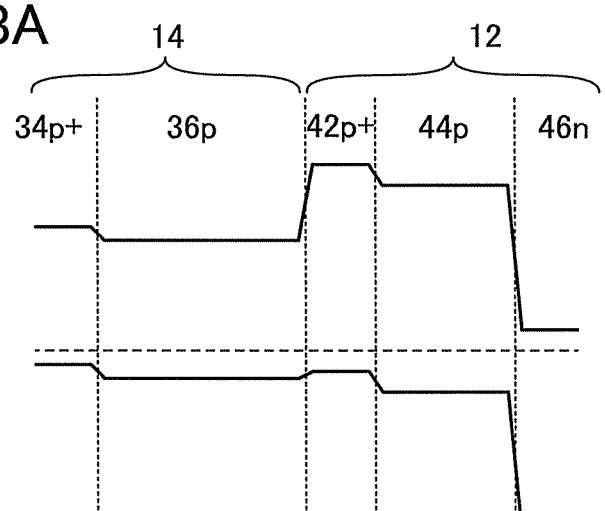
FIGS. 8A and 8B are diagrams illustrating energy band structures of a photoelectric conversion device of a conventional example.
Figure 8B:
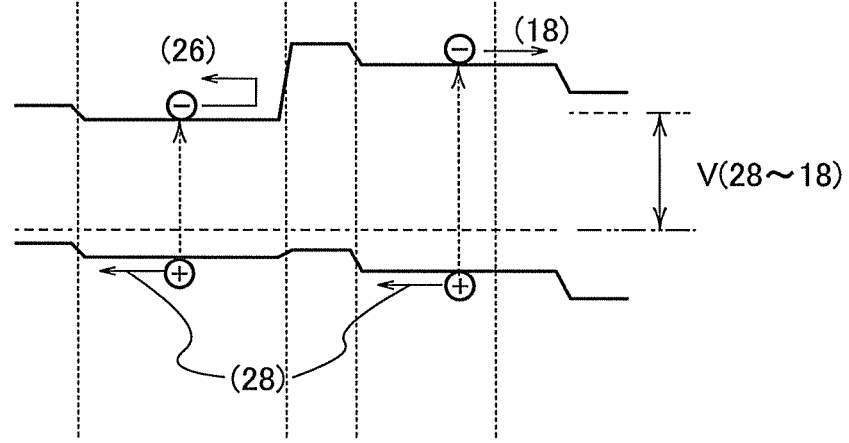

As a reference, FIGS. 8A and 8B illustrate energy band structures of (i) in the solar cell 10 illustrated in FIG. 3. FIG. 8A illustrates an energy band structure in an equilibrium state, and FIG. 8B illustrates an energy band structure at the time of light irradiation.

Voltage V in FIG. 8B which is obtained in (i) of the solar cell 10 is equal to voltage that is obtained in the case where a photoelectric conversion device of a single junction is formed in the upper cell 12 (see V(28~18) in FIG. 8B).

As shown in FIGS. 5A and 5B, in (I) of the photoelectric conversion device 100 illustrated in FIG. 1, voltage equal to the sum of voltage that is obtained in the case where a photoelectric conversion device of a single junction is formed in the first cell 120 and voltage that is obtained in the case where a photoelectric conversion device of a single junction is formed in the second cell 140 can be obtained. On the other hand, as shown in FIGS. 8A and 8B, voltage that is obtained in (i) of the solar cell 10 illustrated in FIG. 3 is substantially equal to only a voltage that is obtained in the case where a photoelectric conversion device of a single junction is formed in the upper cell 12 corresponding to the second cell.

As described above, higher voltage can be obtained in the photoelectric conversion device 100 illustrated in FIG. 1 than in the solar cell 10 illustrated in FIG. 3. In addition, since high voltage can be obtained in the photoelectric conversion device 100 illustrated in FIG. 1, photoelectric conversion efficiency thereof can be improved.

Figure 6A:
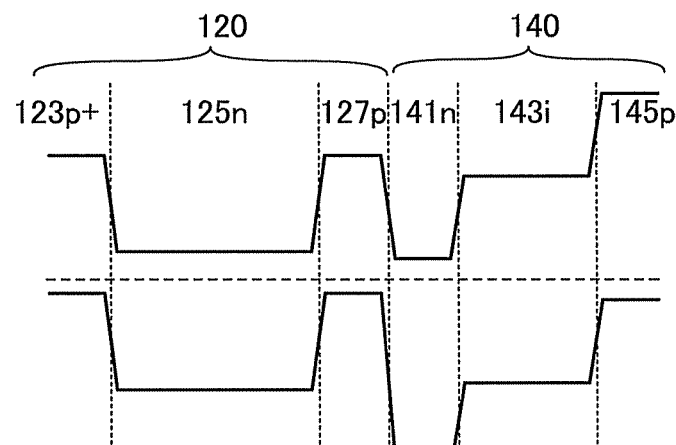
FIGS. 6A and 6B are diagrams illustrating energy band structures of a photoelectric conversion device.
Figure 6B:
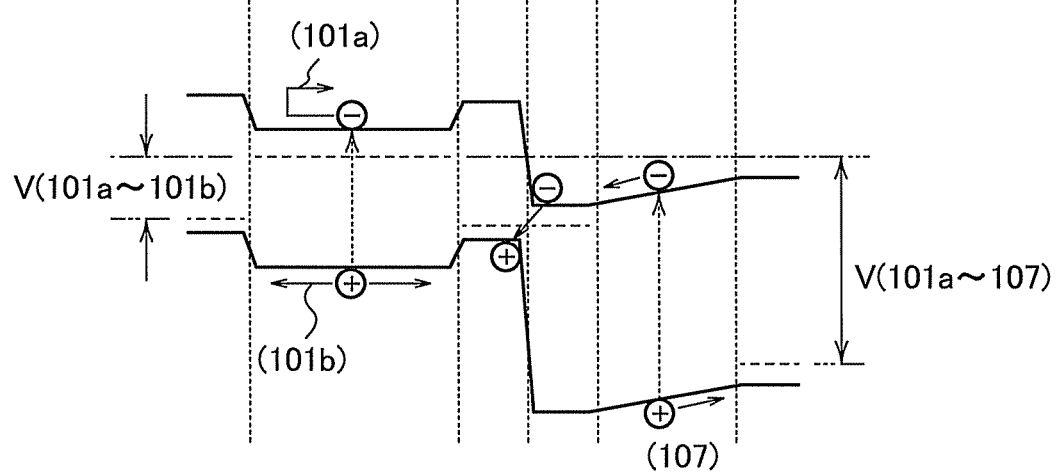
Figure 7A:
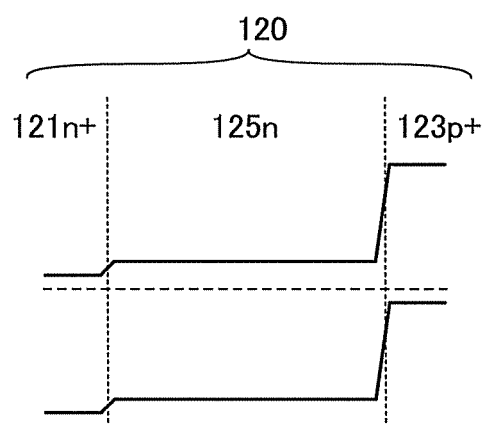
FIGS. 7A and 7B are diagrams illustrating energy band structures of a photoelectric conversion device.
Figure 7B:
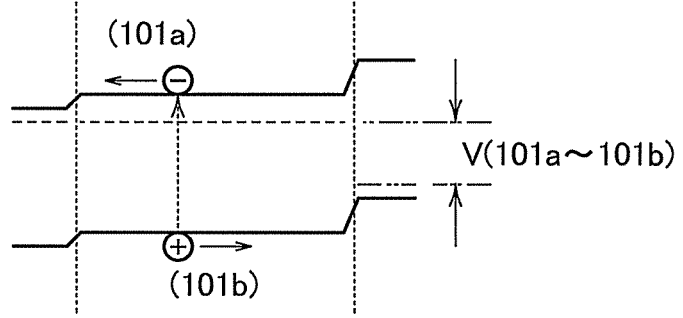
Figure 9A:
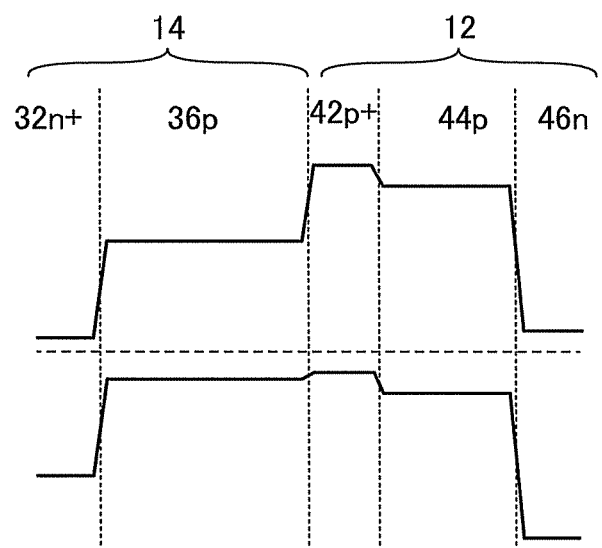
FIGS. 9A and 9B are diagrams illustrating energy band structures of a photoelectric conversion device of a conventional example.
Figure 9B:
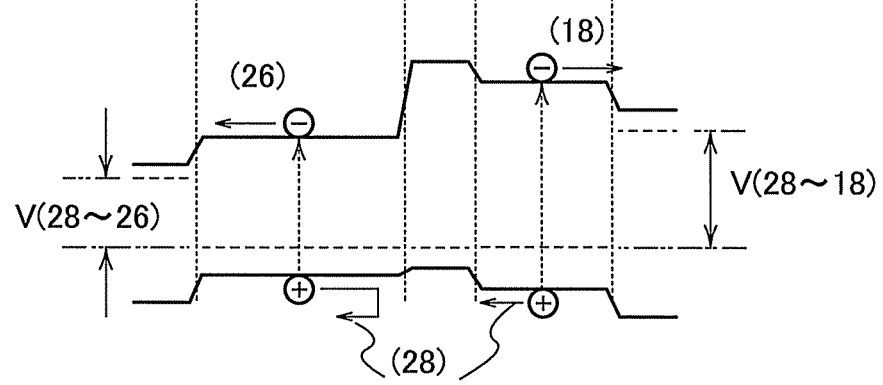
Figure 10A:
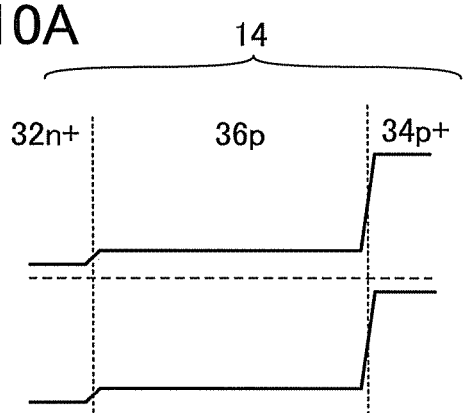
FIGS. 10A and 10B are diagrams illustrating energy band structures of a photoelectric conversion device of a conventional example.
Figure 10B:
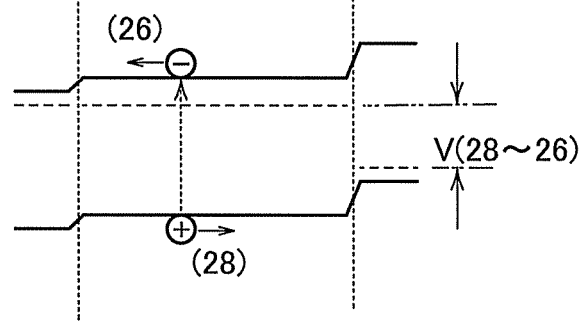

FIGS. 6A and 6B and FIGS. 7A and 7B illustrate energy band structures of (II) (between the third electrode 107 and the second electrode 101*b*) and energy band structures of (III) in the photoelectric conversion device 100 illustrated in FIG. 1, respectively. FIG. 6A and FIG. 7A illustrate energy band structures in an equilibrium state, and FIG. 6B and FIG. 7B illustrate energy band structures at the time of light irradiation. As a reference, FIGS. 9A and 9B and FIGS. 10A and 10B illustrate energy band structures of (ii) (between the negative electrode 26 and the upper electrode 18) and energy band structures of (iii) in the solar cell 10 illustrated in FIG. 3, respectively. FIG. 9A and FIG. 10A illustrate energy band structures in an equilibrium state, and FIG. 9B and FIG. 10B illustrate energy band structures at the time of light irradiation.

Voltage V obtained in (III) of the photoelectric conversion device 100 is equal to voltage that is obtained in the case where a photoelectric conversion device of a single junction is formed in the first cell 120 (see V(101*a* ~101*b*) in FIG. 7B).

Voltage V obtained in (iii) of the solar cell 10 is equal to voltage that is obtained in the case where a photoelectric conversion device of a single junction is formed in the lower cell 14 (see V(28~26) in FIG. 10B).

According to FIGS. 7A and 7B and FIGS. 10A and 10B, voltage obtained between the rear electrodes, that is, voltage obtained between the first electrode 101*a* and the second electrode 101*b* in the photoelectric conversion device 100 of FIG. 1 and voltage obtained between the positive electrode 28 and the negative electrode 26 in the solar cell 10 of FIG. 3, are each substantially equal to voltage that is obtained in the case where a photoelectric conversion device of a single junction is formed in a cell provided on the rear surface side. However, in the photoelectric conversion device 100 illustrated in FIG. 1, high voltage can be obtained in (I) as described above. Therefore, in the entire photoelectric conversion device 100 illustrated in FIG. 1, higher voltage can be obtained than in the solar cell 10 illustrated in FIG. 3, so that the total output of the photoelectric conversion device 100 can be high.

Next, operation mechanism at the time of light irradiation in the photoelectric conversion device 100 illustrated in FIG. 1 will be described.

In the photoelectric conversion device 100, the second cell 140 including a diode junction formed of a wide-gap material and the first cell 120 including a diode junction formed of a narrow-gap material are arranged in this order from the light-receiving side. The second cell 140 and the first cell 120 are connected in series. In order to absorb light efficiently, the cell on the light-receiving side of the photoelectric conversion device is preferably formed of a wide-gap material, and the cell on the rear surface side is preferably formed of a narrow-gap material.

Here, light in a short wavelength range (including a visible light range) is more easily absorbed than light in a long wavelength range. Therefore, when the light penetration depths are compared, light in a short wavelength range has a shallow penetration depth, and light in a long wavelength range has a deep penetration depth. When energy is compared, light in a short wavelength range has high energy, and light in a long wavelength range has low energy; thus, it is preferable that light in a short wavelength range be absorbed in the second cell 140 having a wide band gap and light in a long wavelength range be absorbed in the first cell 120 having a narrow band gap. From the above, it is preferable to form a tandem junction by providing the second cell 140 formed using a wide-gap material on the light-receiving side and providing the first cell 120 formed using a narrow-gap material on the rear surface side. With this structure, part of energy obtained from light absorbed by the photoelectric conversion layer in the photoelectric conversion device, which is greater than or equal to that of the energy band gap of the photoelectric conversion layer in the photoelectric conversion device, can be prevented from being lost as thermal energy; thus, power can be generated efficiently.

Current I (101*a*~107) obtained between the third electrode 107 and the first electrode 101*a* is substantially equal to current obtained in the first cell 120 or current obtained in the second cell 140, whichever is small. This is because a p-n junction is formed at a junction between the first cell 120 and the second cell 140, carriers from the first cell 120 and the second cell 140 are recombined at the junction, and current flowing through the first cell 120 and current flowing through the second cell 140 which are connected in series are substantially equal to each other.

In the case where the second cell 140 formed of a wide-gap material and the first cell 120 formed of a narrow-gap material are arranged in this order from the light-receiving side, light in a narrower wavelength range is absorbed and smaller current is obtained in the second cell 140 than in the first cell 120. Accordingly, current I obtained between the third electrode 107 and the first electrode 101*a* is substantially equal to current obtained in the second cell 140.

On the other hand, in the first cell 120 formed of a narrow-gap material, light in a wider wavelength range is absorbed and larger current is obtained than in the second cell 140. In the first cell 120, current equal to that in the second cell 140 flows owing to carrier recombination at a junction between the first cell 120 and the second cell 140 and the current is obtained between the third electrode 107 and the first electrode 101a (through a path of (I)). Current corresponding to carriers that remain in the first cell 120 without being recombined at the junction between the first cell 120 and the second cell 140 can be obtained between the first electrode 101a and the second electrode 101b (through a path of (III)). With the above structure, particularly, with a three-terminal structure including the path of (III), all the current can be obtained without remaining. The amount of current that can be obtained can be increased in the entire photoelectric conversion device 100, so that photoelectric conversion efficiency can be improved.

Operation mechanism of the photoelectric conversion device 100 will be described with reference FIGS. 5A and 5B, FIGS. 6A and 6B, and FIGS. 7A and 7B. Note that FIGS. 5A and 5B, FIGS. 6A and 6B, and FIGS. 7A and 7B illustrate the energy band structures of (I), the energy band structures of (II), and the energy band structures of (III) in the photoelectric conversion device 100 illustrated in FIG. 1, respectively.

At the time of light irradiation in the photoelectric conversion device 100 which is illustrated in FIG. 5B, holes generated by light absorption in the second cell 140 can be taken out as current from the third electrode 107. Electrons generated by light absorption in the second cell 140 are recombined with part of holes generated in the first cell 120 at the junction between the cells, so that current flows. Electrons generated by light absorption in the first cell 120 can be taken out as current from the first electrode 101a. The other part of holes generated by light absorption in the first cell 120, which are not recombined at the junction between the cells, can be taken out as current from the second electrode 101b through the path of (III) in FIG. 1.

The energy band structure illustrated in FIG. 5B shows that current which can be obtained between the third electrode 107 and the first electrode 101a is substantially equal to current generated by light absorption in the second cell 140.

At the time of light irradiation illustrated in FIG. 6B, holes generated by light absorption in the second cell 140 can be taken out as current from the third electrode 107. Electrons generated by light absorption in the second cell 140 are recombined with part of holes generated by light absorption in the first cell 120 at the junction between the cells, so that current flows. Electrons generated by light absorption in the second cell 120 can be taken out as current from the first electrode 101a through the path of (III). The other part of holes generated by light absorption in the second cell 120, which are not recombined at the junction between the cells, can be taken out as current from the second electrode 101b through the path of (III).

At the time of light irradiation illustrated in FIG. 7B, holes generated by light absorption in the first cell 120 can be taken out as current from the second electrode 101b, and electrons generated by light absorption in the first cell 120 can be taken out as current from the first electrode 101a.

From the energy band structures illustrated in FIG. 5B, FIG. 6B, and FIG. 7B, it is found that current corresponding to carriers which are not recombined at the junction between the first cell 120 and the second cell 140 and remain in the first cell 120 can be obtained between the first electrode 101a and the second electrode 101b.

As described above, by employing the structure of the photoelectric conversion device 100 illustrated in FIG. 1 and taking out all the current, the amount of current that can be obtained in the entire photoelectric conversion device 100 can be increased, so that photoelectric conversion efficiency can be improved.

For comparison, a difference from operation mechanism of the solar cell 10 illustrated in FIG. 3 will be described. FIGS. 8A and 8B, FIGS. 9A and 9B, and FIGS. 10A and 10B illustrate the energy band structures of (i), the energy band structures of (ii), and the energy band structures of (iii) in the solar cell 10 illustrated in FIG. 3 respectively.

The upper cell 12 of the solar cell 10 corresponds to the second cell 140 of the photoelectric conversion device 100. In a similar manner, the lower cell 14, the upper electrode 18, the positive electrode 28, and the negative electrode 26 correspond to the first cell 120, the third electrode 107, the first electrode 101a, and the second electrode 101b, respectively.

At the time of light irradiation in the solar cell 10 which is illustrated in FIG. 8B, holes generated by light absorption in the upper cell 12 can be taken out as current from the positive electrode 28. Electrons generated by light absorption in the upper cell 12 can be taken out as current from the upper electrode 18. Holes generated by light absorption in the lower cell 14 can be taken out as current from the positive electrode 28. Electrons generated by light absorption in the lower cell 14 can be taken out as current from the negative electrode 26 through a path of (iii).

From the energy band structure illustrated in FIG. 8B, it is found that since the lower cell 14 has only one polarity (the p-layer) and a p-n junction is not formed at the junction between the lower cell 14 and the upper cell 12, current due to holes can be obtained between the positive electrode 28 and the upper electrode 18 in (i) of the solar cell 10 illustrated in FIG. 3. Fermi levels and potentials of the p-layer in the lower cell 14 and the $p^+$-layer ($42p^+$) in the upper cell 12 are substantially equal to each other, and an energy barrier between the p-layer in the lower cell 14 and the $p^+$-layer ($42p^+$) in the upper cell 12 is small, so that holes move without being recombined at the junction between the lower cell 14 and the upper cell 12.

At the time of light irradiation which is illustrated in FIG. 9B, holes generated by light absorption in the upper cell 12 can be taken out as current from the positive electrode 28 through the path of (i). Electrons generated by light absorption in the upper cell 12 can be taken out as current from the upper electrode 18. Holes generated by light absorption in the lower cell 14 can be taken out as current from the positive electrode 28. Electrons generated by light absorption in the lower cell 14 can be taken out as current from the negative electrode 26.

At the time of light irradiation illustrated in FIG. 10B, holes generated by light absorption in the lower cell 14 can be taken out as current from the positive electrode 28, and electrons generated by light absorption in the lower cell 14 can be taken out as current from the negative electrode 26.

Comparison of FIGS. 5A and 5B, FIGS. 6A and 6B, and FIGS. 7A and 7B with FIGS. 8A and 8B, FIGS. 9A and 9B, and FIGS. 10A and 10B shows a difference in operation mechanism between the photoelectric conversion device 100 illustrated in FIG. 1 and the solar cell 10 illustrated in FIG. 3.

The photoelectric conversion device 100 in FIG. 1 can have the characteristics denoted by (I) and (III) in FIG. 4, with the energy band structures in FIGS. 5A and 5B, FIGS. 6A and 6B, and FIGS. 7A and 7B. The photoelectric conversion device 100 outputs voltage and current obtained between the third electrode 107 and the first electrode 101a and between the first electrode 101a and the second electrode 101b, which can be used as power. In the photoelectric conversion device 100 illustrated in FIG. 1, a diode junction of a p-n junction is formed at the junction between the cells, and photoexcited carriers are recombined and current flows in the same direction as a forward direction, so that at the junction, photoelectromotive force is not generated and Fermi levels and potentials of the cells are substantially equal to each other. Therefore, photoelectromotive force generated in the first cell 120 and the second cell 140 can be independently maintained. Electrons and holes recombined at the p-n junction between the first cell 120 and the second cell 140 contribute to voltage obtained between the third electrode 107 and the first electrode 101a, and the voltage can be utilized. Consequently, photoelectric conversion efficiency can be improved.

This embodiment can be combined with the structure described in any of other embodiments as appropriate.

(Embodiment 3)

In this embodiment, a structure which is different from that of the photoelectric conversion device 100 of FIG. 1 described in the above embodiment will be described. Specifically, an example of an emitter structure in which impurity semiconductor regions with varied impurity concentrations are provided on a surface side of a first cell 120, which faces a second cell 140, will be described. Note that components which are the same as those in FIG. 1 are denoted by the same reference numerals, and detailed description of such components is omitted.

Figure 11:
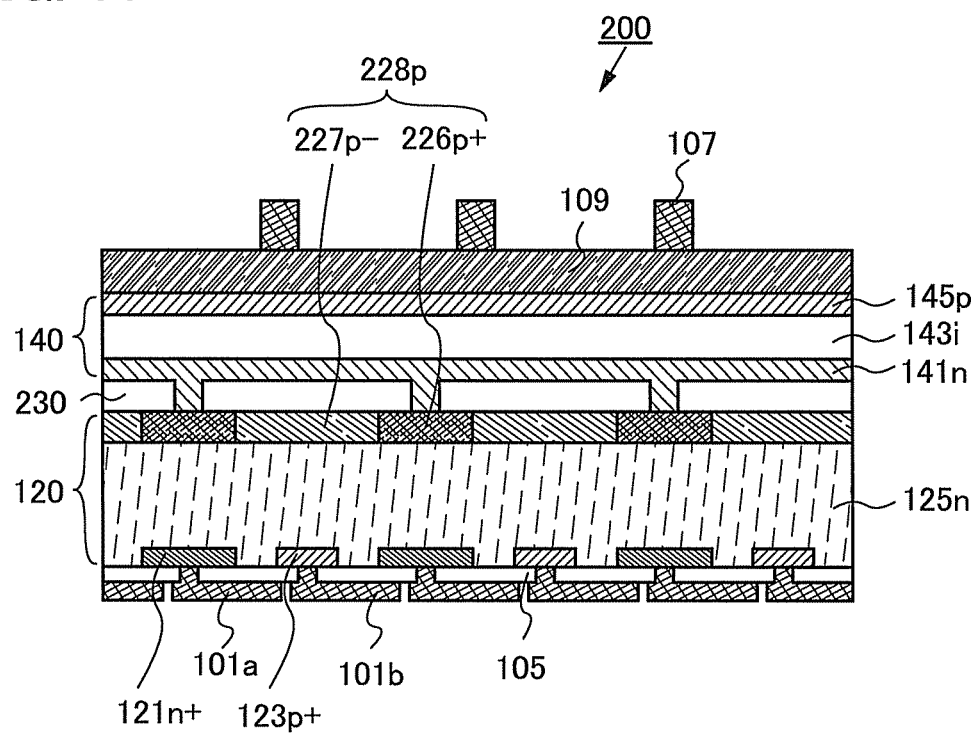
FIG. 11 is a schematic cross-sectional view illustrating anther example of a photoelectric conversion device.

A photoelectric conversion device 200 illustrated in FIG. 11 is a tandem photoelectric conversion device in which the first cell 120 and the second cell 140 are sequentially stacked as in the photoelectric conversion device 100 illustrated in FIG. 1.

On the surface side of the first cell 120 which faces the second cell 140, not a semiconductor layer having a uniform impurity concentration but an impurity semiconductor layer including semiconductor regions having varied impurity concentrations is provided. For example, as illustrated in FIG. 11, an emitter structure provided with a fourth impurity semiconductor layer 228p is used. The fourth impurity semiconductor layer 228p includes a fourth high-concentration impurity semiconductor region $226p^+$ and a fourth low-concentration impurity semiconductor region $227p^-$. The fourth high-concentration impurity semiconductor region $226p^+$ and the fourth low-concentration impurity semiconductor region $227p^-$ contain an impurity element at different concentrations, for example. Here, the fourth high-concentration impurity semiconductor region $226p^+$ contains an impurity element at a higher concentration than in the fourth low-concentration impurity semiconductor region $227p^-$. In this embodiment, an example in which the fourth high-concentration impurity semiconductor region $226p^+$ and the fourth low-concentration impurity semiconductor region $227p^-$ are p-type semiconductor regions is described.

An insulating layer 230 is provided between the first cell 120 and the second cell 140. The insulating layer 230 is provided with an opening.

The first cell 120 and the second cell 140 are in contact with each other through the opening provided in the insulating layer 230, and a p-n junction is formed in a contact portion therebetween. Specifically, the opening is provided in the insulating layer 230 such that the fourth high-concentration impurity semiconductor region $226p^+$ included in the first cell 120 is exposed. A fifth impurity semiconductor layer 141n included in the second cell 140 is provided so as to fill the opening provided in the insulating layer 230. With such a structure, the fourth high-concentration impurity semiconductor region $226p^+$ and the fifth impurity semiconductor layer 141n are in contact with each other. In order to form a p-n junction in the contact portion, one of the fourth high-concentration impurity semiconductor region $226p^+$ and the fifth impurity semiconductor layer 141n is formed of a p-type semiconductor, and the other is formed of an n-type semiconductor.

As for basic operation mechanism of the photoelectric conversion device 200 illustrated in FIG. 11, the description of the energy band structures with reference to FIGS. 5A and 5B, FIGS. 6A and 6B, and FIGS. 7A and 7B is referred to.

In the fourth impurity semiconductor layer 228p, the fourth high-concentration impurity semiconductor region $226p^+$ is provided only in a region which is jointed to the fifth impurity semiconductor layer 141n of the second cell 140, and the fourth low-concentration impurity semiconductor region $227p^-$ is formed in the other region, whereby loss of recombination of photoexcited carriers can be reduced in the fourth impurity semiconductor layer 228p. In addition, by providing the insulating layer 230 between the second cell 140 and the first cell 120, reflectivity of the fifth impurity semiconductor layer 141n can be increased, whereby photoelectric current can be increased because the amount of light absorption is increased in the second cell 140, and the second cell 140 can be thinned owing to light confinement.

With the use of an emitter structure, photoelectric conversion efficiency can be improved. Also when the photoelectric conversion device according to this embodiment is a tandem photoelectric conversion device provided with an emitter structure, high voltage and large current can be obtained, whereby photoelectric conversion efficiency can be improved.

This embodiment can be combined with the structure described in any of other embodiments as appropriate.

(Embodiment 4)

The photoelectric conversion device described in any of the above embodiments can be applied to a variety of electronic devices. A plurality of the photoelectric conversion devices described in any of the above embodiments can be connected to be integrated for application. In this embodiment, an example of using the photoelectric conversion device as a power source of an electronic book reader will be described.

Figure 12A:
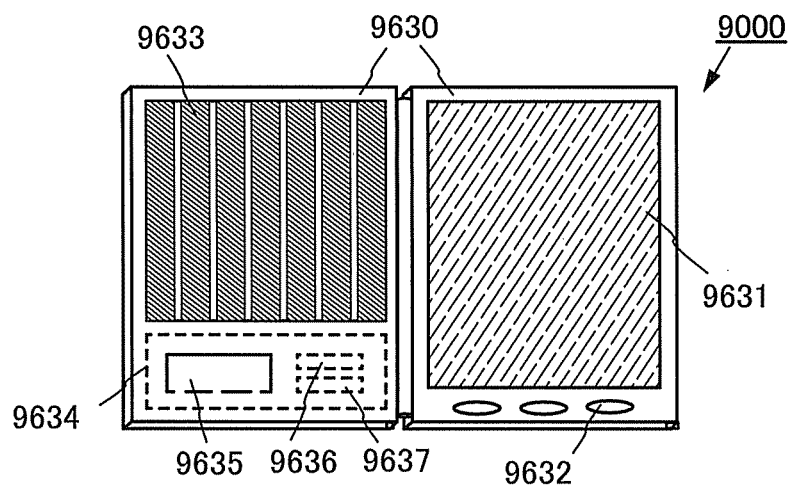
FIGS. 12A and 12B are views illustrating an example of an electronic device.

FIG. 12A is a schematic view of an electronic book reader (also referred to as an e-book reader). An electronic book reader 9000 includes housings 9630, a display area 9631, operation keys 9632, a photoelectric conversion device 9633, and a charge and discharge control circuit 9634. The electronic book reader 9000 illustrated in FIG. 12A has a function of displaying various kinds of data (e.g., a still image, a moving image, and a text image) on the display area, a function of displaying a calendar, a date, the time, or the like on the display area, a function of operating or editing the data displayed on the display area, a function of controlling processing by various kinds of software (programs), and the like. In FIG. 12A, a structure including a battery 9635, a DCDC converter 9636, and a DCDC converter 9637 is illustrated as an example of the charge and discharge control circuit 9634. By employing the photoelectric conversion device described in any of the above embodiments for the photoelectric conversion device 9633, power can be generated efficiently.

Note that the photoelectric conversion device 9633 can be provided in not only the illustrated region but also a space (a surface or a rear surface) of the housing 9630 as appropriate. When a lithium ion battery is used as the battery 9635, there is an advantage of downsizing or the like.

Figure 12B:
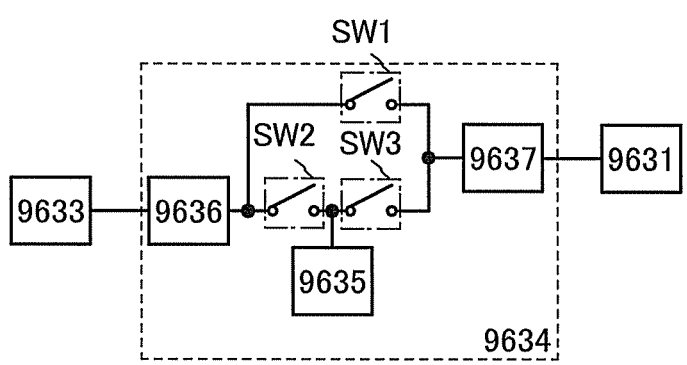

The structure and the operation of the charge and discharge control circuit 9634 illustrated in FIG. 12A will be described with reference to a block diagram in FIG. 12B. FIG. 12B illustrates the photoelectric conversion device 9633, the charge and discharge control circuit 9634, and the display area 9631. The battery 9635, the DCDC converter 9636, the DCDC converter 9637, and switches SW1 to SW3 are included in the charge and discharge control circuit 9634.

An example of the operation in the case where power is generated by the photoelectric conversion device 9633 using external light will be described. The voltage of power generated by the photoelectric conversion device is raised or lowered by the DCDC converter 9636 to a suitable voltage for charging the battery 9635. Then, when performing a display in the display area 9631, the switch SW1 is turned on, the voltage of the power is raised or lowered in the DCDC converter 9637 to a voltage that is needed in the display area 9631, and power is supplied to the display area 9631. When display is not performed in the display area 9631, the switch SW1 may be turned off and the switch SW2 may be turned on, whereby the battery 9635 can be charged.

In addition, the operation in the case where power is not generated by the photoelectric conversion device 9633 owing to lack of external light will be described. By turning on the switch SW3, the voltage of power that is stored in the battery 9635 is raised or lowered by the DCDC converter 9637 to a voltage that is needed in the display area 9631, and then supplied to the display area 9631.

Note that in this embodiment, although two DCDC converters are provided between the photoelectric conversion device and the display area, the DCDC converters therebetween may be omitted in a structure that allows directly supplying power to the display area from the photoelectric conversion device, directly charging the battery from the photoelectric conversion device, or directly supplying power to the display area from the battery.

Note that although an example of using only the photoelectric conversion device 9633 is described as an example of a power generation means, the battery 9635 may be charged by a combination of the photoelectric conversion device 9633 and another photoelectric conversion device with a structure different from that of the photoelectric conversion device 9633. Furthermore, the combination may be a combination of the photoelectric conversion device 9633 and another power generation means.

This embodiment can be combined with the structure described in any of other embodiments as appropriate.

This application is based on Japanese Patent Application serial no. 2010-138889 filed with Japan Patent Office on Jun. 18, 2010, the entire contents of which are hereby incorporated by reference.

What is claimed is:

1. A photoelectric conversion device comprising:
a first cell including a photoelectric conversion layer;
a second cell stacked over the first cell and including a photoelectric conversion layer formed of a material having a wider band gap than that of the first cell;
a first electrode and a second electrode provided under a surface of the first cell which is opposite to the second cell; and
a third electrode provided over a surface of the second cell which is opposite to the first cell,
wherein the first cell and the second cell each include a p-n junction or a p-i-n junction therein,
wherein the first cell and the second cell are in contact with each other and a p-n junction is formed in a contact portion therebetween,
wherein the first cell is electrically connected to the first electrode and the second electrode to form a back contact structure,
wherein the second cell is electrically connected to the third electrode,
wherein first voltage and first current are obtained between the first electrode and the third electrode, and
wherein second voltage and second current are obtained between the first electrode and the second electrode.

2. The photoelectric conversion device according to claim 1, wherein the third electrode is electrically connected to the second cell via a transparent conductive film.

3. A photoelectric conversion device comprising:
a first cell including a photoelectric conversion layer;
a second cell stacked over the first cell and including a photoelectric conversion layer formed of a material having a wider band gap than that of the first cell;
an insulating layer provided between the first cell and the second cell and including an opening;
a first electrode and a second electrode provided under a surface of the first cell which is opposite to the second cell; and
a third electrode provided over a surface of the second cell which is opposite to the first cell,
wherein the first cell and the second cell each include a p-n junction or a p-i-n junction therein,
wherein the first cell and the second cell are in contact with each other through the opening provided in the insulating layer and a p-n junction is formed in a contact portion therebetween,
wherein the first cell is electrically connected to the first electrode and the second electrode to form a back contact structure,
wherein the second cell is electrically connected to the third electrode,
wherein first voltage and first current are obtained between the first electrode and the third electrode, and
wherein second voltage and second current are obtained between the first electrode and the second electrode.

4. The photoelectric conversion device according to claim 3, wherein the third electrode is electrically connected to the second cell via a transparent conductive film.

5. A photoelectric conversion device comprising:
a first cell including a photoelectric conversion layer;
a second cell stacked over the first cell and including a photoelectric conversion layer formed of a material having a wider band gap than that of the first cell;
a first electrode and a second electrode provided under a surface of the first cell which is opposite to the second cell; and
a third electrode provided over a surface of the second cell which is opposite to the first cell,
wherein the first cell and the second cell each include a p-n junction or a p-i-n junction therein,
wherein the first cell and the second cell are in contact with each other and a p-n junction is formed in a contact portion therebetween,
wherein the first cell is electrically connected to the first electrode and the second electrode to form a back contact structure,
wherein the second cell is electrically connected to the third electrode,
wherein the photoelectric conversion layer included in the first cell comprises single crystal silicon or polycrystalline silicon,
wherein the photoelectric conversion layer included in the second cell comprises amorphous silicon,
wherein first voltage and first current are obtained between the first electrode and the third electrode, and
wherein second voltage and second current are obtained between the first electrode and the second electrode.

6. The photoelectric conversion device according to claim 5, wherein the third electrode is electrically connected to the second cell via a transparent conductive film.

7. A photoelectric conversion device comprising:
a first cell including a photoelectric conversion layer;
a second cell stacked over the first cell and including a photoelectric conversion layer formed of a material having a wider band gap than that of the first cell;
an insulating layer provided between the first cell and the second cell and including an opening;
a first electrode and a second electrode provided under a surface of the first cell which is opposite to the second cell; and
a third electrode provided over a surface of the second cell which is opposite to the first cell,
wherein the first cell and the second cell each include a p-n junction or a p-i-n junction therein,
wherein the first cell and the second cell are in contact with each other through the opening provided in the insulating layer and a p-n junction is formed in a contact portion therebetween,
wherein the first cell is electrically connected to the first electrode and the second electrode to form a back contact structure,
wherein the second cell is electrically connected to the third electrode,
wherein the photoelectric conversion layer included in the first cell comprises single crystal silicon or polycrystalline silicon,
wherein the photoelectric conversion layer included in the second cell comprises amorphous silicon,
wherein first voltage and first current are obtained between the first electrode and the third electrode, and
wherein second voltage and second current are obtained between the first electrode and the second electrode.

8. The photoelectric conversion device according to claim 7, wherein the third electrode is electrically connected to the second cell via a transparent conductive film.

* * * * *